United States Patent
Law et al.

(10) Patent No.: US 8,928,183 B2
(45) Date of Patent: Jan. 6, 2015

(54) CIRCUIT AND METHOD FOR GENERATING A PULSE SIGNAL

(75) Inventors: Choi Look Law, Singapore (SG); Chao Fang, Singapore (SG)

(73) Assignee: Nanyang Technological University, Singapore (SG)

( * ) Notice: Subject to any disclaimer, the term of this patent is extended or adjusted under 35 U.S.C. 154(b) by 999 days.

(21) Appl. No.: 12/992,140

(22) PCT Filed: May 12, 2009

(86) PCT No.: PCT/SG2009/000170
§ 371 (c)(1),
(2), (4) Date: Feb. 15, 2011

(87) PCT Pub. No.: WO2009/139727
PCT Pub. Date: Nov. 19, 2009

(65) Prior Publication Data
US 2011/0260551 A1   Oct. 27, 2011

Related U.S. Application Data

(60) Provisional application No. 61/052,498, filed on May 12, 2008.

(51) Int. Cl.
*H03K 3/00* (2006.01)
*H03K 3/64* (2006.01)
*H04L 25/02* (2006.01)
*H03K 5/13* (2014.01)
*H04B 1/717* (2011.01)

(52) U.S. Cl.
CPC ............. *H04L 25/026* (2013.01); *H03K 3/64* (2013.01); *H03K 5/13* (2013.01); *H04B 1/7174* (2013.01); *H04L 25/0284* (2013.01)
USPC ........................................................... 307/106

(58) Field of Classification Search
USPC ........................................................... 307/106
See application file for complete search history.

(56) References Cited

U.S. PATENT DOCUMENTS

2005/0095980 A1   5/2005   Chang

OTHER PUBLICATIONS

Khan, S., et al., "Pulse Generation With Reduced Ringing for Ultra Wide Band Applications in Indoor Wireless Communication," Semiconductor Electronics, 2006. ICSE '06, IEEE International Conference on Oct. 29, 2006-Dec. 1, 2006, p. 843-845.
The International Search Report from corresponding Int'l Application No. PCT/SG2009/000170 dated Jul. 8, 2009.

*Primary Examiner* — Carlos Amaya
(74) *Attorney, Agent, or Firm* — Snell & Wilmer L.L.P.

(57) ABSTRACT

Embodiments provide a circuit and a method for generating a pulse signal. The circuit includes a generating circuit configured to generate a first pulse signal, a branching circuit coupled to the generating circuit and configured to branch the first pulse signal into a second pulse signal and a third pulse signal, and a reflection element coupled to the branching circuit to reflect the second pulse signal. The circuit further includes a combining circuit, which is coupled to the reflection element and the branching circuit and is configured to combine the reflected second pulse signal and the third pulse signal to generate a fourth pulse signal.

19 Claims, 8 Drawing Sheets $\tau_g$ =120ps, $\tau_2$ =30ps, m = 9

$\tau_g = 120\text{ps}, \quad \tau_2 = 30\text{ps}, \quad m = 9$ $\tau_g$ =140ps, $\tau_1$ =70ps, n = 4, m = 3

$\tau_g$ =240ps, $\tau_1$ =120ps, n = 6, m = 5

$\tau_g$ =122ps, $\tau_1$ =61ps, n = 10, m = 9

US 8,928,183 B2

CIRCUIT AND METHOD FOR GENERATING A PULSE SIGNAL

CROSS-REFERENCE TO RELATED APPLICATION

This application is U.S. national phase filing under 35 U.S.C. §371 of PCT/SG2009/000170 filed 12 May 2009 claims the benefit of priority of U.S. provisional application 61/052,498 filed on 12 May 2008, the entire contents of which are incorporated here by reference for all purposes.

TECHNICAL FIELD

Embodiments relate generally to a circuit and a method for generating a pulse signal.

BACKGROUND

Ultra wideband (UWB) has emerged as one of the most promising wireless systems recently for several reasons. Firstly, its multi-path resistance results in better power transmission efficiency. Secondly, its low average power spectral density causes less interference to other services sharing the same band. Thirdly, it is capable of precise location positioning.

Nowadays, there are many different UWB spectrum and regulatory approvals in the world. The US Federal Communications Commission (FCC) has utilized the 3.1 to 10.6 GHz band; the European Communications Commission (ECC) has announced support for the 6 to 8.5 GHz band, while Japan looks set to ratify the 7 to 10 GHz band. In order to accommodate various different UWB spectrum regulations, a UWB pulse generator with programmable UWB pulse center frequency and −10 dB bandwidth is desired.

UWB pulse generation is critical for an impulse radio (IR-UWB) system. Current IR-UWB pulse generation methods fall into four main categories. One approach is to generate a pulse at baseband and then up-convert to the target frequency band. These carrier-based designs tend to have complex architectures, high power consumption and LO leakage problem due to the need of a local oscillator. A second approach is to generate pulses directly in UWB band. This approach usually requires additional pulse shaping using high order band pass filter (BPF) which occupies large area, and is harder to be programmable. In a third approach, a new waveform synthesis method based on high-speed digital-to-analog converters (DAC) was proposed for UWB pulse generation. It has both good time and amplitude resolution, and can generate different pulses with different center frequencies and −10 dB bandwidths. However, high sampling rate is required, which will result in large circuit complexity and power consumption. A fourth approach is to combine different delay edges with the polarity controls to form a very short duration "logical" pulse, which is then filtered so as to obtain an UWB pulse. With this approach, the center frequency and −10 dB bandwidth of the pulse can be programmed by varying the delay between edges and the number of edges combined.

There is a need to provide a UWB pulse generating circuit which is programmable with reduced circuit complexity and with large peak power.

SUMMARY

An Embodiment provides a circuit for generating a pulse signal. The circuit includes a generating circuit configured to generate a first pulse signal, a branching circuit coupled to the generating circuit and configured to branch the first pulse signal into a second pulse signal and a third pulse signal, and a reflection element coupled to the branching circuit to reflect the second pulse signal. The circuit further includes a combining circuit, which is coupled to the reflection element and the branching circuit and is configured to combine the reflected second pulse signal and the third pulse signal to generate a fourth pulse signal.

Another embodiment provides a corresponding method for generating a pulse signal. The method includes generating a first pulse signal, branching the first pulse signal into a second pulse signal and a third pulse signal, reflecting the second pulse signal, and combining the reflected second pulse signal and the third pulse signal to generate a fourth pulse signal.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
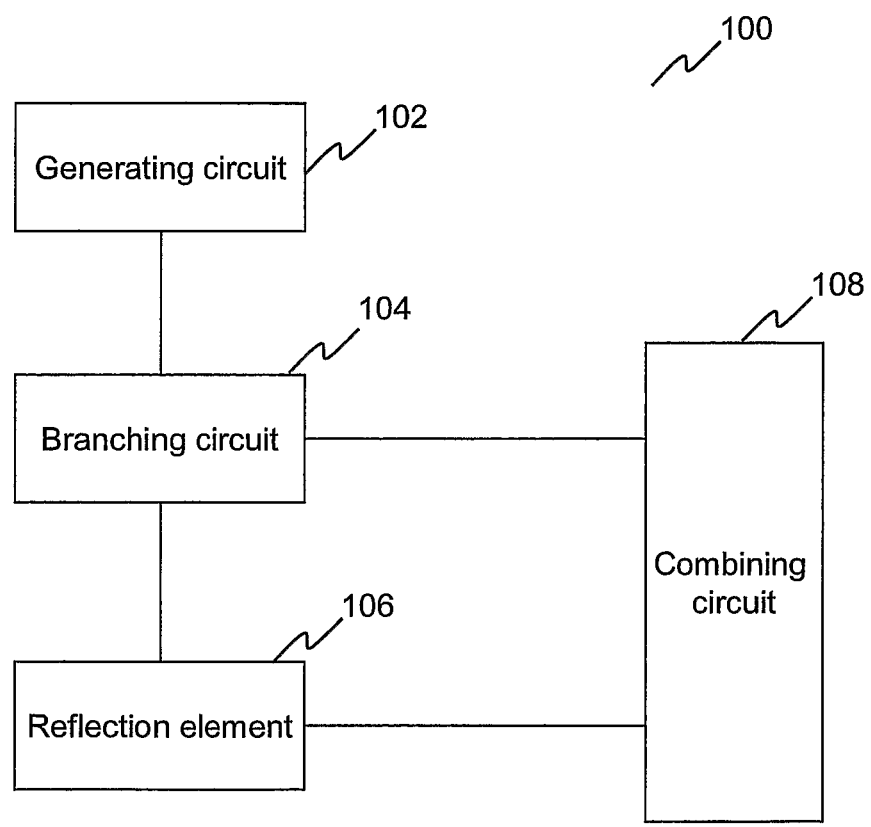
FIG. 1 shows a block diagram illustrating a circuit for generating a pulse signal according to an embodiment.

Embodiments provide a circuit and a method for generating a pulse signal.

A circuit may be understood as an electrical circuit comprising a plurality of connected electrical or electronic components to perform a particular function. A circuit may also be understood as including a hard-wired circuit such as e.g. a circuit implemented as an application-specific integrated circuit (ASIC), or a microwave monolithic integrated circuit (MMIC), or a hard-wired logic gate structure, or a programmable circuit such as e.g. a field-programmable gate array (FPGA), or any other programmable logic, e.g. implemented as a microprocessor being programmed to provide the respective function of the circuit.

According to an embodiment, the circuit includes a generating circuit configured to generate a first pulse signal, a branching circuit coupled to the generating circuit and configured to branch the first pulse signal into a second pulse signal and a third pulse signal, and a reflection element coupled to the branching circuit to reflect the second pulse signal. The circuit further includes a combining circuit, which is coupled to the reflection element and the branching circuit and is configured to combine the reflected second pulse signal and the third pulse signal to generate a fourth pulse signal.

In an embodiment, the combining circuit may comprise a filter element. The reflected second pulse signal and the third pulse signal, after being combined, may be filtered by the filter element to generate the fourth pulse signal. The filter element may be a high pass filter in an embodiment, and may be other forms of filter in other embodiments.

In one embodiment, the first pulse signal may be a Guassian pulse. In another embodiment, the first pulse signal may be a square wave pulse signal. The first pulse signal may also be pulse signal in other wave forms, depending on the desired pulse signal to be generated.

The circuit may include a delay element for delaying the second pulse signal. The delay element may be a delay line, such as an analog delay line. For example, the delayed second pulse signal may be transmitted to the reflection element to reflect the delayed second pulse signal.

In an embodiment, the branching circuit may comprise a branch line. For example, the branch line may be a wire or cable. The branch line may be coupled to a first line and a second line in a coupling point, such that the second pulse signal travels along the second line away from the coupling point and the third pulse signal travels along the first line away from the coupling point.

In an embodiment, the reflection element is coupled to the second line, e.g., to receive the second pulse signal travelling along the second line from the coupling point. The second line may include a delay element for delaying the second pulse signal, such that the delayed second pulse signal travels to the reflection element.

According to an embodiment, the generating circuit is configured to generate the first pulse signal from an original pulse signal. The original pulse signal may be in a desired wave form, such as a Gaussian pulse or a square wave pulse.

In an embodiment, the circuit may further include, e.g. in the generating circuit, a modifying circuit for modifying the original pulse signal to generate the first pulse signal. The modifying circuit may be an amplifying circuit to amplify the original pulse signal to generate the first pulse signal.

In an embodiment, the generating circuit is further configured to generate at least one further first pulse signal from the original pulse signal. The combining circuit is configured to combine the reflected second pulse signal and the third pulse signal and the at least one further first pulse signal, so as to generate the fourth pulse signal.

In another embodiment, the generating circuit is configured to generate at least one further first pulse signal from the original pulse signal. The circuit may include a further branching circuit coupled to the generating circuit, wherein the further branching circuit is configured to branch the further first pulse signal into a further second pulse signal and a further third pulse signal. The reflection element is coupled to the further branching circuit to reflect the further second pulse signal. The combining circuit is configured to combine the reflected second pulse signal, the third pulse signal, the reflected further second pulse signal and the further third pulse signal to generate the fourth pulse signal.

In one embodiment, the generating circuit is configured to generate the at least one further first pulse signal from the original pulse signal by delaying the original pulse signal. For example, the generating circuit may include a delay element to delay the original pulse signal by at least one time period.

In another embodiment, the generating circuit may be configured to generate the at least one further first pulse signal from the delayed original pulse signal by amplifying the delayed original pulse signal. For example, the generating circuit may include a amplifying circuit to amplify the delayed original pulse signal. The thus generated first pulse signal is amplified before being branched, reflected and combined, thus allowing a high energy pulse signal to be generated.

In an embodiment, the combining circuit may include a line to which the reflected second pulse signal and the third pulse signal are fed. In another embodiment, the at least one further first pulse signal is also fed to the line of the combining circuit. In a further embodiment, the reflected further second pulse signal and the further third pulse signal are fed to the line of the combining circuit.

The combining circuit may be configured to generate the fourth pulse signal in accordance with a pre-defined frequency mask.

The fourth pulse signal generated according to an embodiment is an UWB pulse signal.

Another embodiment provides a corresponding method for generating a pulse signal. The method includes generating a first pulse signal, branching the first pulse signal into a second pulse signal and a third pulse signal, reflecting the second pulse signal, and combining the reflected second pulse signal and the third pulse signal to generate a fourth pulse signal.

FIG. 1 shows a block diagram illustrating a circuit for generating a pulse signal according to an embodiment.

The circuit 100 includes a generating circuit 102 configured to generate a first pulse signal. A branching circuit 104 is coupled to the generating circuit 102, and is configured to branch the received first pulse signal into a second pulse signal and a third pulse signal.

A reflection element 106 is coupled to the branching circuit 104 to receive the second pulse signal. The reflection element 106 is configured to reflect the received second pulse signal to generate a reflected second pulse signal.

The circuit 100 further includes a combining circuit 108, which is coupled to the reflection element 106 to receive the reflected second pulse signal and is coupled to the branching circuit 104 to receive the third pulse signal. The combining circuit 108 is configured to combine the reflected second pulse signal and the third pulse signal to generate a fourth pulse signal.

The generating circuit 102 may be configured to generate the first pulse signal from an original pulse signal, for example, by amplifying the original pulse signal.

The generating circuit 102 may be further configured to generate at least one further first pulse signal from the original pulse signal, for example, by delaying the original pulse signal by at least one time period. The at least one further first pulse signal may be used by the combined circuit 108 to generate the fourth pulse signal.

The branching circuit 104 may include a branching line to branch the first pulse signal into the second pulse signal and the third pulse signal. The branching line may be coupled to a first line and a second line in a coupling point, such that the second pulse signal travels along the second line away from the coupling point and the third pulse signal travels along the first line away from the coupling point.

In another embodiment, the circuit 100 may include a further branching circuit (not shown) configured to branch one or more of the at least one further first pulse signal into at least one further second pulse signal and at least one further third pulse signal.

The reflection element 106 may be coupled to the second line to receive the second pulse signal. In another embodiment, the second line may include a delay element to delay the second pulse signal, such that the reflection element 106 is coupled to receive the delayed second pulse signal. The reflection element 106 is configured to reflect the received second pulse signal or the received delayed second pulse signal to generate the reflected second pulse signal. The reflected second pulse signal may have a polarity opposite to the second pulse signal.

In an embodiment, the reflection element 106 may be coupled to receive one or more of the at least one further second pulse signal to generate at least one reflected further second pulse signal.

The combining circuit 108 may be configured to combine the reflected second pulse signal and the third pulse signal. The combining circuit 108 may further include a filter element, e.g., a high pass filter, to filter the combined signal to generate the fourth pulse signal. In another embodiment, the combining circuit 108 may be configured to generate the fourth pulse signal in accordance with a pre-defined frequency mask.

The fourth pulse signal as generated by the circuit 100 of an embodiment may be a UWB pulse signal.

Figure 2:
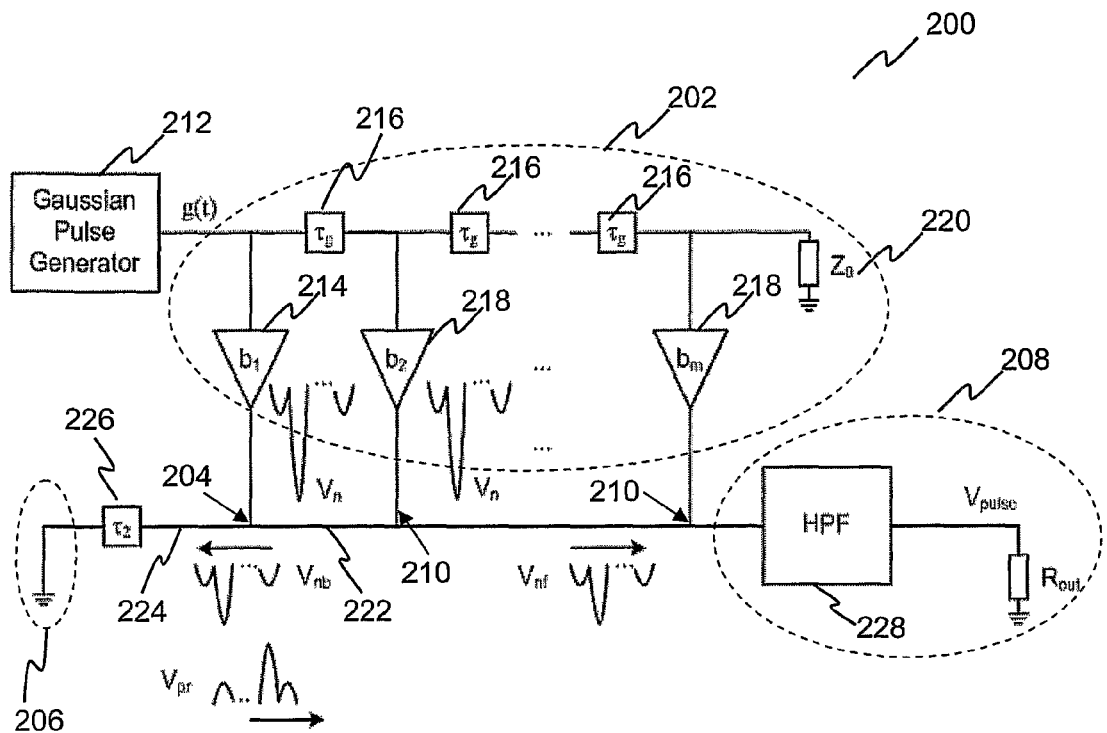
FIG. 2 shows an exemplary circuit for generating a pulse signal according to an embodiment.

FIG. 2 shows an exemplary circuit for generating a pulse signal according to an embodiment.

The circuit 200 includes a generating circuit 202 configured to generate a first pulse signal V. The generating circuit 202 may be configured to generate the first pulse signal $V_n$ from an original pulse signal g(t). The original pulse signal g(t) may be generated by a pulse generator, for example, a Gaussian pulse generator 212 as shown in FIG. 2. In this embodiment, the generating circuit 202 includes an amplifying circuit 214 with an amplifying coefficient $b_1$ to amplify the original pulse signal g(t), thereby generating the first pulse signal $V_n$.

The generating circuit 202 may be further configured to generate at least one further first pulse signal $V_n$ from the original pulse signal g(t). For example, the generating circuit 202 includes a delay line with a plurality of taps 216, which delays the original pulse signal g(t) with the delay time $\tau_g$ between the taps 216. The generating circuit 202 may further include a plurality of further amplifying circuits 218 with a plurality of amplifying coefficients $b_2 \ldots b_m$ to amplify the delayed original pulse signal, thereby generating the at least one further first pulse signal $V_n$.

The generating circuit 202 may be terminated by a matched load $Z_0$ 220 to prevent reflections.

In this context, $V_n$ may represent the first pulse signal, or the at least one further first pulse signal, as described above. It may also represent the combined first pulse signal and the further first pulse signals. The first pulse signal $V_n$ and the at least one further first pulse signal $V_n$ may be fed to the branching circuit 204 separately, or may be combined to form a combined first pulse signal $V_n$ which is then fed to the branching circuit 204.

In this embodiment, the amplifying coefficients $b_1$-$b_m$ are negative coefficients. Accordingly, the first pulse signal $V_n$, or the at least one further pulse signal $V_n$, or the combined first pulse signal and the further first pulse signals $V_n$ is a negative polarity pulse signal. In other embodiments, the amplifying coefficients $b_1$-$b_m$ may be positive coefficients, such that the first pulse signal or the at least one further first pulse signal or the combined first pulse signal is a positive polarity pulse signal.

A branching circuit 204 is configured to branch the first pulse signal $V_n$ into a second pulse signal $V_{nb}$ travelling along a backward direction and a third pulse signal $V_{nf}$ travelling along a forward direction. The branching circuit 204 may include a branching line to branch the first pulse signal V. The branching line may be coupled to a first line 222 and a second line 224 in a coupling point, such that the second pulse signal $V_{nb}$ travels along the second line 224 away from the coupling point and the third pulse signal $V_{nf}$ travels along the first line 222 away from the coupling point.

The circuit 200 may include a further branching circuit 210 configured to branch one or more of the at least one further first pulse signal $V_n$ into at least one further second pulse signal $V_{nb}$ and at least one further third pulse signal $V_{nf}$.

A reflection element 206 is configured to reflect the second pulse signal $V_{nb}$ to generate a reflected second pulse signal $V_{pf}$. In this example, the reflection element 206 is coupled to the second line 224 to receive the second pulse signal $V_{nb}$. The second line 224 may include a delay element 226 for delay the second pulse signal $V_{nb}$ with the delay time $\tau_2$. The reflection element 206 may include a short circuit, such that when the second pulse signal $V_{nb}$ passes through the delay element 226 to hit the short circuit, the second pulse signal $V_{nb}$ is reflected with an inverse polarity. For example, if the second pulse signal $V_{nb}$ being branched from the first pulse signal $V_n$ is a negative polarity pulse, the reflected second pulse signal $V_{pf}$ is a positive polarity pulse.

The second pulse signal $V_{nb}$ reflected by the reflection element 206 as illustrated above may include the at least one further second pulse signal $V_{nb}$ generated from the taps 216 and the further branching circuit 210. In another embodiment, the at least one further second pulse signal $V_{nb}$ may be directly sent to the reflection element 206 to generate at least one reflected further second pulse signal $V_{pf}$.

A combining circuit 208 (which may also be seen to include sections of the connection between the branching circuit 204 and a high pass filter 228 of the combining circuit 208) is configured to combine the reflected second pulse signal $V_{pf}$ and the third pulse signal $V_{nf}$ to generate a fourth pulse signal $V_{pulse}$. The reflected second pulse signal $V_{pf}$ may have combined therein the reflected further second pulse signal $V_{pf}$, and the third pulse signal $V_{nf}$ may have combined therein the further third pulse signal $V_{nf}$. As described above, if the reflected second pulse signal $V_{pf}$ is a positive polarity pulse and the third pulse signal $V_{nf}$ is a negative polarity pulse, the fourth pulse signal $V_{pulse}$ generated therefrom is a pulse signal with both positive and negative polarities. The fourth pulse signal $V_{pulse}$ may be a UWB pulse signal in an embodiment.

The combining circuit 208 may include a filter element, e.g., a high pass filter 228, to filter the combined signal to generate the fourth pulse signal. In an embodiment, the combining circuit 208 may be configured to generate the fourth pulse signal in accordance with a pre-defined frequency mask.

The embodiment in FIG. 2 provides a simple circuit to generate a pulse signal with both positive and negative polarities. In the embodiment, a positive (or negative) polarity pulse is generated from the reflected negative (or positive) polarity pulse, and is then combined with the negative (or positive) polarity pulse to form a pulse signal with both positive and negative polarities. Thus, the circuit according to the embodiment eliminates the need to provide a polarity control signal and allows a simplified circuit design.

Figure 3:
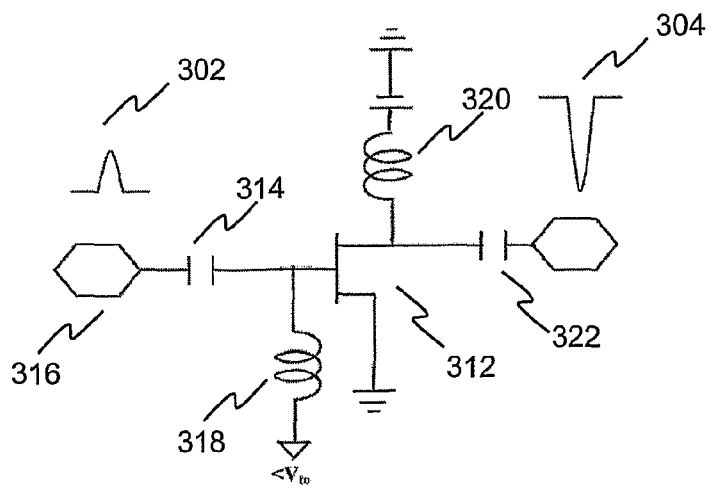
FIG. 3 shows a diagram of Class C operation with pulse input.

The negative coefficient amplifying circuits 214, 218 in FIG. 2 above may be implemented in Class C operation mode. FIG. 3 shows a diagram of Class C operation with pulse input.

Through the Class C operation of FIG. 3, a positive pulse input 302 is transformed to a negative pulse output 304. The polarity of the positive pulse input 302 is inverted, and the amplitude of the positive pulse input 302 is increased, thereby achieving the negative amplified pulse 304.

The diagram of FIG. 3 shows a transistor 312, which may be a microwave frequency field effect device (e.g., LDMOS, MESFET, PHEMT, GaN HEMI) connected in common source configuration or may be a microwave bi-polar device (e.g., BJT, HBT) in common emitter configuration to provide high power gain. The transistor 312 is biased by a waveform $V_{to}$ at the gate of the field effect device 312 or base of the bi-polar device 312. The waveform $V_{to}$ is designed to place the transistor 312 in the off state before and after the arrival of the positive pulse input 302. For example, the transistor 312 is turned on by the positive pulse input 302 in combination with waveform $V_{to}$ upon the arrival of the positive pulse input 302 (class C operational mode).

A first capacitor 314 is used to isolate the DC bias voltage of $V_{to}$ from the circuit 316 generating the positive pulse input 302. A first inductor 318 is used to couple the waveform $V_{to}$ to the gate of the transistor 312 and isolate the positive pulse input 302 from the circuit generating the waveform $V_{to}$.

A second inductor 320 is used at the drain of the transistor 312 to inject the DC supply voltage and isolate the amplified negative pulse output 304 from the DC supply. A second capacitor 322 is used at the drain of the transistor 312 to isolate the DC supply voltage from the branching and combining circuit. The negative pulse output 304 flows through the capacitor 322 to the branching and combining circuit.

Through Class C design of FIG. 3, the pulse generation circuit 202 of FIG. 2 is automatically switched on and off when the Gaussian pulse g(t) is coming and going off, respectively. Together with the inherent high power efficiency of the Class C operation, the circuit of FIG. 2 is able to achieve very high power added efficiency when the negative coefficient amplifying circuits 214, 218 are designed to be Class C operation mode for the pulse based UWB system.

Figure 4:
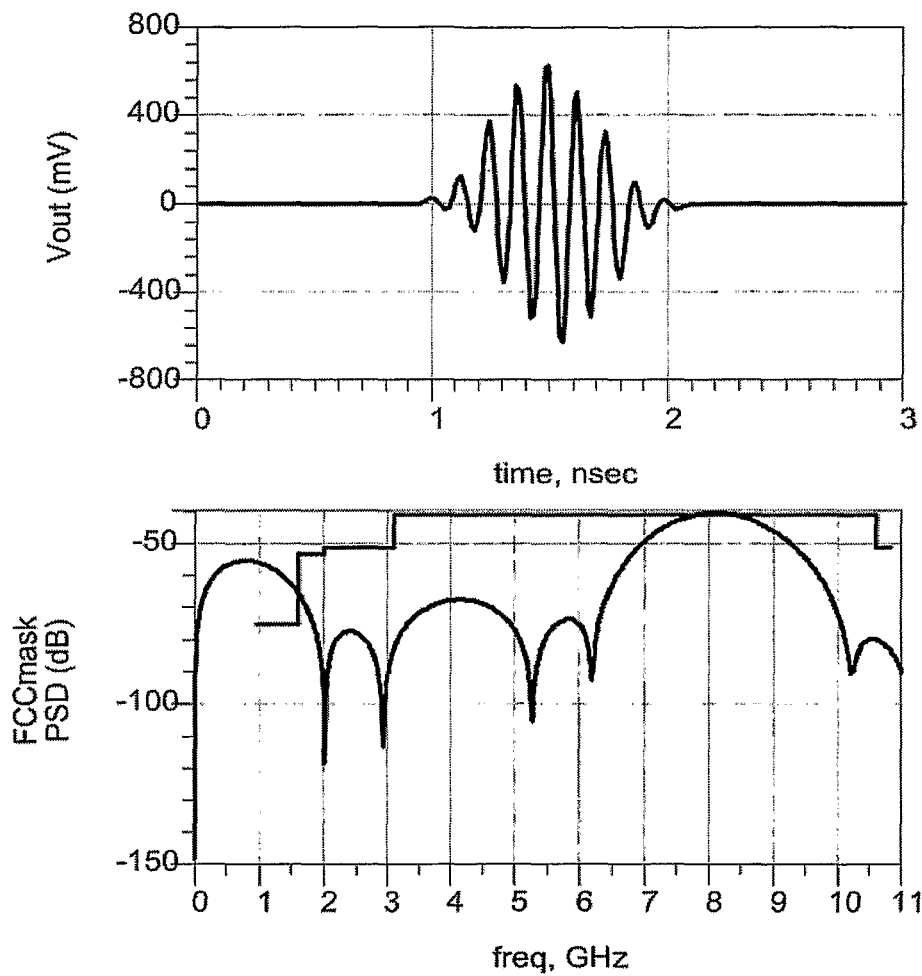
FIG. 4 illustrates simulation results of a pulse signal generated by the circuit of FIG. 2.

FIG. 4 illustrates simulation results of a pulse signal generated by the circuit of FIG. 2.

As shown in FIG. 4, the simulated waveform and spectrum of the fourth pulse signal, in this example the UWB pulse, generated by the circuit of FIG. 2 are illustrated. The UWB pulse in FIG. 4 is generated by the combination circuit without using the high pass filter 228.

In this simulation, the delay time $\tau_g$ of the delay taps 216 is set to 120 ps, and the delay time $\tau_2$ of the delay element 226 is set to 30 ps. The total number m of delay taps and amplifying circuits is set to 9.

As the high pass filter is not used to generate the UWB pulse of FIG. 4, the UWB pulse of FIG. 4 does no meet the FCC spectrum mask.

Figure 5:
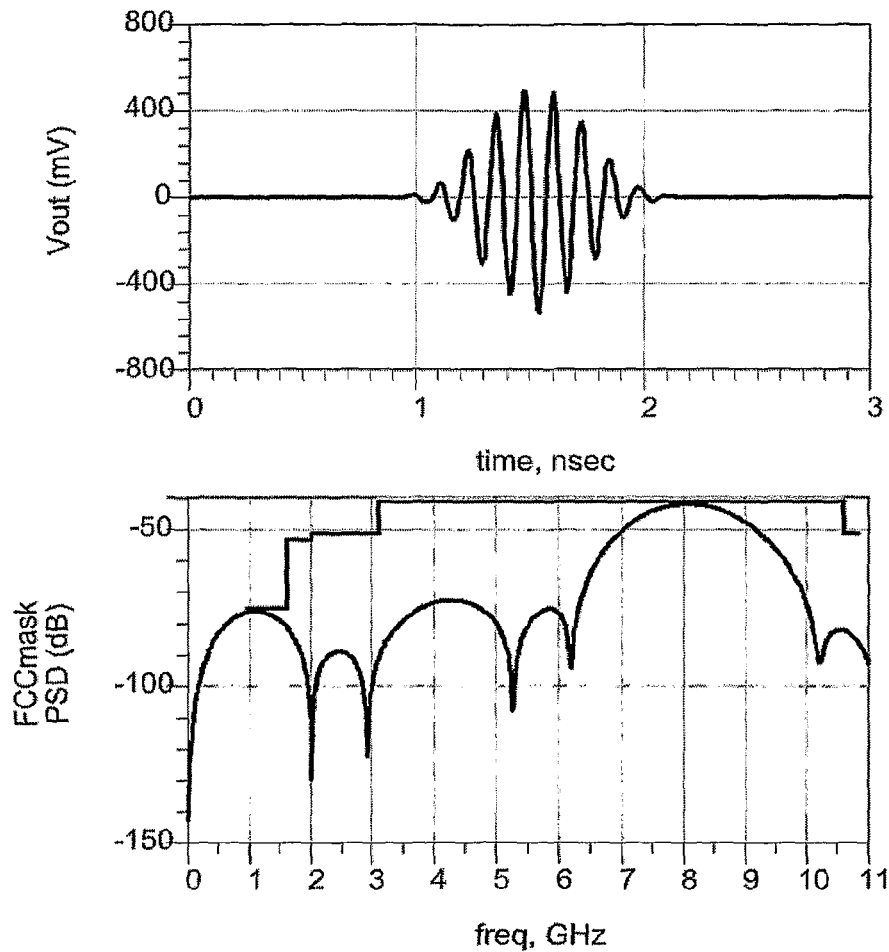
FIG. 5 illustrates simulation results of a pulse signal generated by the circuit of FIG. 2.

FIG. 5 illustrates simulation results of a pulse signal generated by the circuit of FIG. 2.

As shown in FIG. 5, the simulated waveform and spectrum of the fourth pulse signal, in this example the UWB pulse, generated by the circuit of FIG. 2 are illustrated. The UWB pulse in this example is generated after passing through the high pass filter 228, e.g. through a first order high pass filter, in order to meet the FCC spectrum mask.

Similar to the simulation of FIG. 4 above, the delay time $\tau_g$ of the delay taps 216 is set to 120 ps, and the delay time $\tau_2$ of the delay element 226 is set to 30 ps. The total number m of delay taps and amplifying circuits is set to 9.

As the high pass filter is used to generate the UWB pulse, the UWB pulse meets the FCC spectrum mask. In an embodiment, when the circuit of FIG. 2 is used in a UWB transmitter, the UWB TX antenna may be used to perform the function of the high pass filter.

The circuit of FIG. 2 is programmable by adjusting the delay elements $\tau_g$, $\tau_2$ and the number of delay taps m. For example, by tuning the value of $\tau_g$ and $\tau_2$, the center frequency of the generated UWB pulse $V_{pulse}$ can be programmed. Under predetermined values of $\tau_g$ and $\tau_2$, the numbers of the delay taps m may vary the length of the generated UWB pulse $V_{pulse}$. Thus, the center frequency and the bandwidth of the generated UWB pulse can be programmed by varying the delay between each pulse and the number of delayed pulses in the circuit of the embodiments above, as will be described in more detail below.

Figure 6:
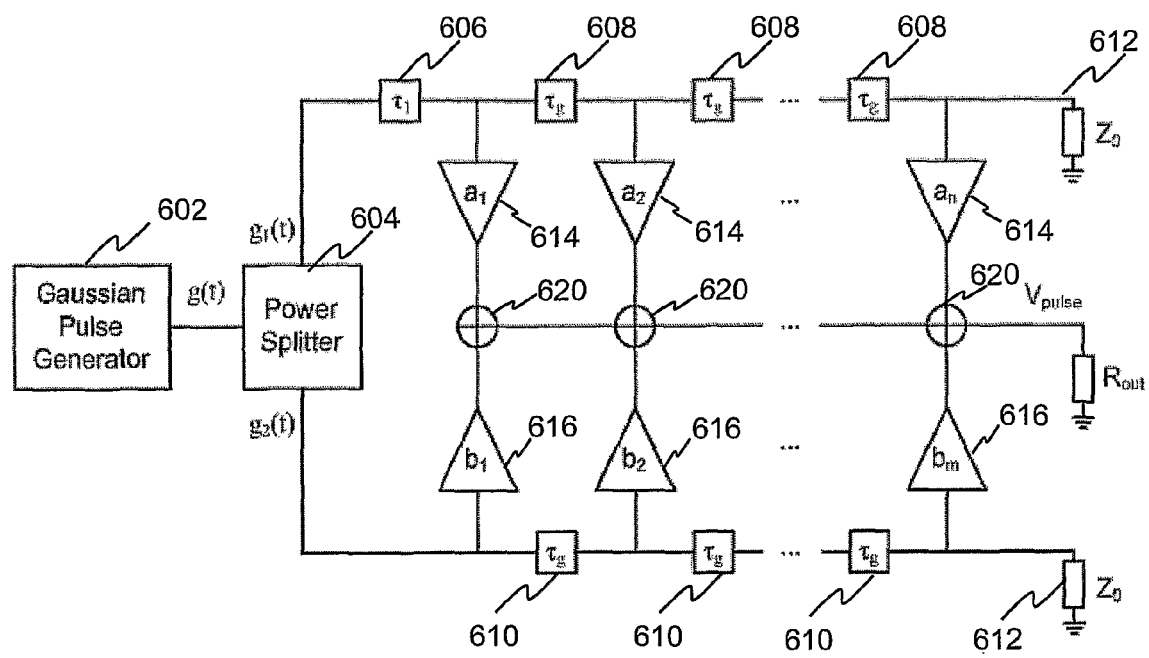
FIG. 6 shows an example of a circuit for generating a pulse signal.

FIG. 6 shows an example of a circuit for generating a pulse signal.

A Gaussian pulse generator 602 is configured to generate a narrow Gaussian pulse g(t), which is split into a first Gaussian pulse $g_1(t)$ and a second Gaussian pulse $g_2(t)$ by a power splitter 604.

The first Gaussian pulse $g_1(t)$ is delayed by a first delay element 606 with a delay time $\tau_1$, and is then distributed to one or more first delay taps 608 with a delay time $\tau_g$ between the taps 608.

A plurality of first amplifying circuits 614 is provided corresponding to each of the first delay element 606 and the first delay taps 608. Accordingly, the delayed first Gaussian pulses output from the first delay element 606 and from the one or more first delay taps 608 are distributed to the corresponding first amplifying circuits 614 to be amplified. In this example, the amplifying coefficients $a_1 \ldots a_n$ of the first amplifying circuits 614 is of positive values, and the amplified delayed first Gaussian pulses are positive polarity pulses.

The second Gaussian pulse $g_2(t)$ is directly distributed to one or more second delay taps 610 with a delay time $\tau_g$ between the taps 610.

A plurality of second amplifying circuits 616 is provided corresponding to each of the second delay taps 610. Accordingly, the delayed second Gaussian pulses output from the one or more second delay taps 610 are distributed to the corresponding second amplifying circuits 616 to be amplified. In this example, the amplifying coefficients $b_1 \ldots b_m$ of the second amplifying circuits 616 is of negative values, and the amplified delayed second Gaussian pulses are negative polarity pulses.

The first Gaussian pulse $g_1(t)$ and the second Gaussian pulse $g_2(t)$ are terminated by a matched load $Z_0$ 612 to prevent reflections.

The delayed and amplified first Gaussian pulses with the positive polarity and the delayed and amplified second Gaussian pulses with the negative polarity are combined by one or more combining circuits 620, so as to generate a final output pulse $V_{pulse}$ with both positive and negative polarities.

The final output pulse $V_{pulse}$ as generated by the circuit of FIG. 6 may be represented by the following equation:

$$V_{pulse} = \sum_{i=1}^{n} a_n g_1[t - \tau_1 - (i-1)\tau_g] + \sum_{j=1}^{m} b_m g_2[t - (j-1)\tau_g] \quad (1)$$

The circuit of FIG. 6 is programmable by adjusting the delay elements $\tau_1$, $\tau_g$, the number of first delay taps n, and the number of second delay taps m. By tuning the value of $\tau_1$ and $\tau_g$, the center frequency of the output pulse $V_{pulse}$ can be programmed. Under predetermined values of $\tau_1$ and $\tau_g$, the number of the delay taps n and m may vary the length of the output pulse $V_{pulse}$. Thus, the circuit of FIG. 6 may be programmed to generate a pulse signal, e.g., a UWB pulse, with a desired center frequency and a desired bandwidth, e.g., −10 dB bandwidth.

The programmability of the circuit in FIG. 6 is further illustrated according to simulation results below.

Figure 7:
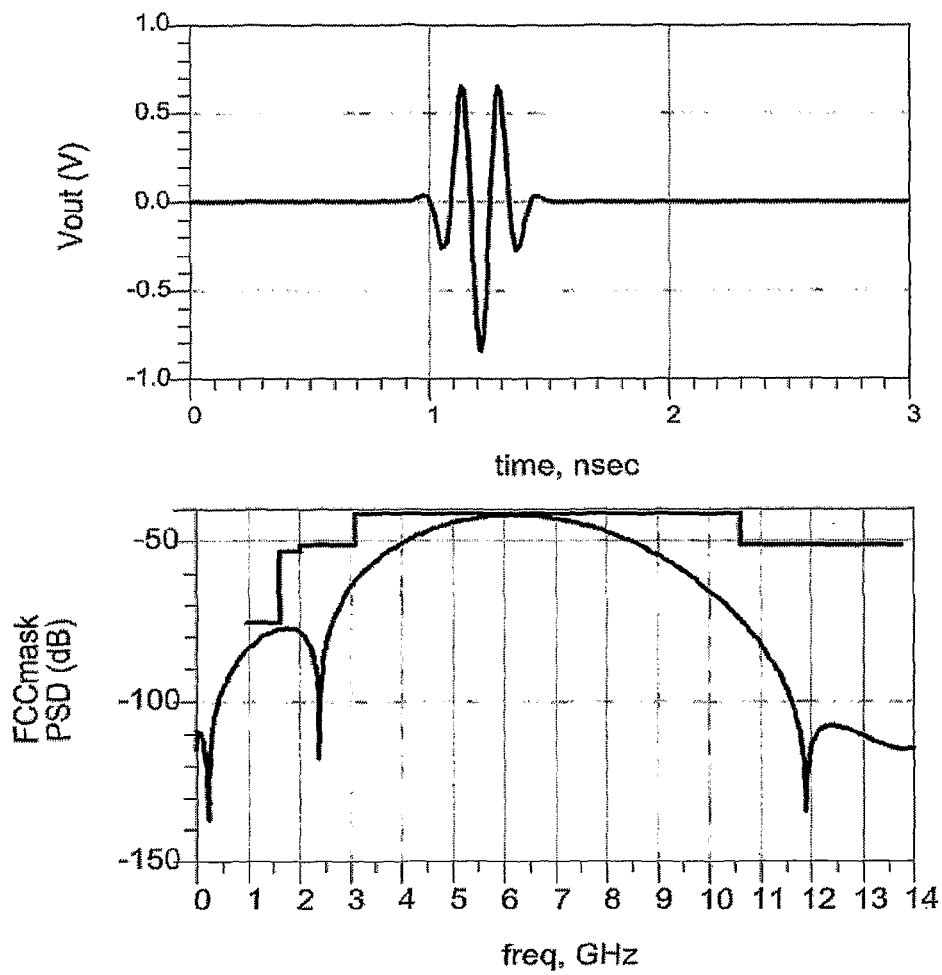
FIGS. 7-9 illustrate simulation results of a pulse signal generated by the circuit of FIG. 6.
Figure 8:
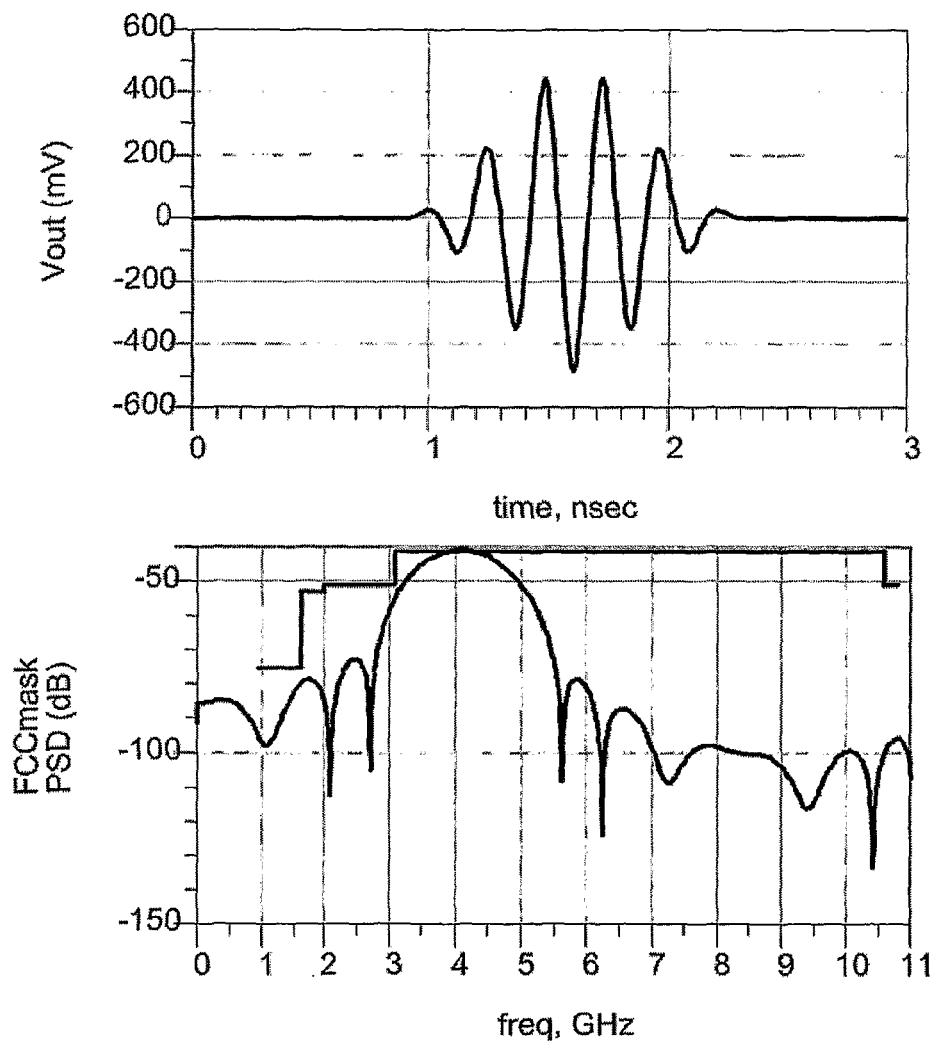
Figure 9:
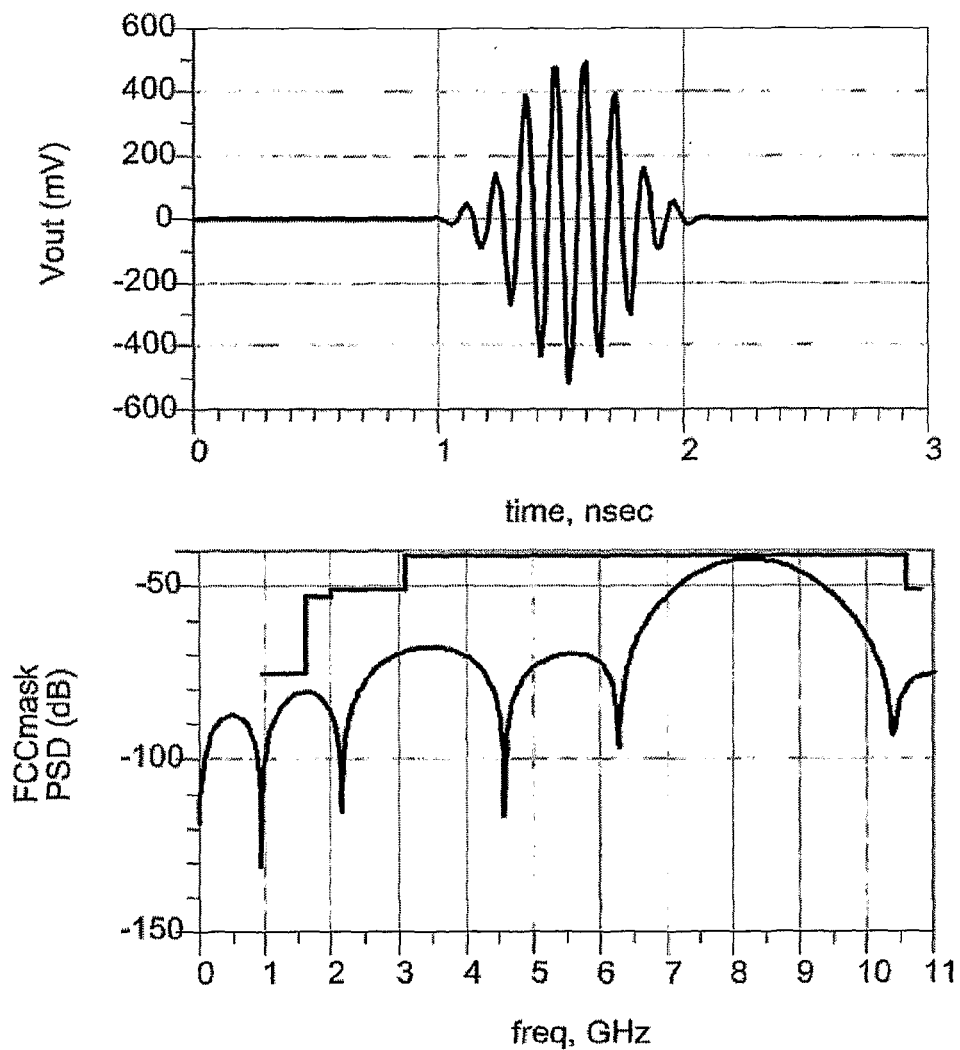

In the simulation, a 200 ps Gaussian pulse is generated by the Gaussian pulse generator 602. With three different combinations of the four parameters $\tau_1$, $\tau_g$, n, and m, the waveforms and the spectrums of the generated pulses A, B, C are shown in FIG. 7, FIG. 8 and FIG. 9 respectively. The center frequencies and −10 dB bandwidth of the generated output pulse and the corresponding parameters $\tau_1$, $\tau_g$, n, and m are listed in Table 1 below.

From Table 1 and FIGS. 7-9, it is shown that the center frequency and bandwidth of the generated pulse signal varies with different parameters of $\tau_1$, $\tau_g$, n, and m. Thus, by adjusting the parameters $\tau_1$, $\tau_g$, n, and m of the circuit, a pulse signal with desired center frequency and bandwidth can be generated.

TABLE 1

CENTER FREQUENCIES AND BANDWIDTHS OF GENERATED OUTPUT PULSES

|  | A | B | C |
|---|---|---|---|
| $\tau_l$ (ps) | 70 | 120 | 61 |
| $\tau_g$ (ps) | 140 | 240 | 122 |
| n (ps) | 3 | 5 | 9 |
| m (ps) | 4 | 6 | 10 |
| Center Frequency (GHz) | 6.2 | 4.1 | 8.2 |
| Bandwidth (GHz) | 4.8 | 1.8 | 2.5 |

The circuit for generating a pulse signal according to various embodiments provides a programmable circuit to generate a pulse signal, e.g. a UWB pulse signal, with programmable center frequency and bandwidth. Thus, the circuit of the various embodiments is easy to be reconfigured in order to accommodate various UWB spectrum regulations. Further, the circuit of the various embodiments provides a simple circuit design, wherein use of a polarity control signal may be eliminated.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A circuit for generating a pulse signal comprising
a generating circuit configured to generate a first pulse signal;
a branching circuit coupled to the generating circuit configured to branch the first pulse signal into a second pulse signal and a third pulse signal;
a reflection element coupled to the branching circuit to reflect the second pulse signal; and
a combining circuit coupled to the reflection element and the branching circuit configured to combine the reflected second pulse signal and the third pulse signal to generate a fourth pulse signal;
wherein the generating circuit is configured to generate the first pulse signal from an original pulse signal; and
wherein the generating circuit is further configured to generate at least one further first pulse signal from the original pulse signal, the circuit comprises a further branching circuit coupled to the generating circuit configured to branch the at least one further first pulse signal into at least one further second pulse signal and at least one further third pulse signal, the reflection element is coupled to the further branching circuit to reflect the at least one further second pulse signal and the combining circuit is configured to combine the reflected second pulse signal, the third pulse signal, the reflected further second pulse signal and the further third pulse signal to generate the fourth pulse signal.

2. The circuit according to claim 1, wherein the combining circuit comprises a filter element.

3. The circuit according to claim 2, wherein the filter element is a high pass filter.

4. The circuit according to claim 1, wherein the first pulse signal is a Gaussian pulse.

5. The circuit according to claim 1, wherein the first pulse signal is a square wave pulse signal.

6. The circuit according to claim 1, comprising a delay element for delaying the second pulse signal.

7. The circuit according to claim 1, wherein the branching circuit comprises a branch line.

8. The circuit according to claim 7, wherein the branch line is coupled to a first line and a second line in a coupling point such that the second pulse signal travels along the second line away from the coupling point and the third pulse signal travels along the first line away from the coupling point.

9. The circuit according to claim 8, wherein the reflection element is coupled to the second line.

10. The circuit according to claim 8, wherein the second line comprises a delay element for delaying the second pulse signal.

11. The circuit according to claim 1, further comprising a modifying circuit for modifying the original pulse signal to generate the first pulse signal.

12. The circuit according to claim 11, wherein the modifying circuit is an amplifying circuit to amplify the original pulse signal to generate the first pulse signal.

13. The circuit according to claim 1, wherein the combining circuit is configured to combine the reflected second pulse signal and the third pulse signal and the at least one further first pulse signal.

14. The circuit according to claim 13, wherein the generating circuit is configured to generate the at least one further first pulse signal from the original pulse signal by delaying the original pulse signal.

15. The circuit according to claim 14, wherein the generating circuit is configured to generate the at least one further first pulse signal from the delayed original pulse signal by amplifying the delayed original pulse signal.

16. The circuit according to claim 1, wherein the combining circuit comprises a line to which the reflected second pulse signal and the third pulse signal are fed.

17. The circuit according to claim 1, wherein the combining circuit is configured to generate the fourth pulse signal in accordance with a pre-defined frequency mask.

18. The circuit according to claim 1, wherein the fourth pulse signal is an UWB pulse signal.

19. A method for generating a pulse signal, comprising
generating a first pulse signal;
branching the first pulse signal into a second pulse signal and a third pulse signal;
reflecting the second pulse signal;
combining the reflected second pulse signal and the third pulse signal to generate a fourth pulse signal;
generating the first pulse signal from an original pulse signal;
generating at least one further first pulse signal from the original pulse signal;
branching the at least one further first pulse signal into at least one further second pulse signal and at least one further third pulse signal;
reflecting the at least one further second pulse signal; and combining the reflected second pulse signal, the third pulse signal, the reflected further second pulse signal and the further third pulse signal to generate the fourth pulse signal.

* * * * *